United States Patent
Sun et al.

(10) Patent No.: US 10,052,613 B2
(45) Date of Patent: Aug. 21, 2018

(54) HIERARCHICAL POROUS MATERIAL AND THE PREPARATION METHOD THEREOF

(71) Applicant: DALIAN INSTITUTE OF CHEMICAL PHYSICS, CHINESE ACADEMY OF SCIENCES, Dalian, Liaoning (CN)

(72) Inventors: Gongquan Sun, Liaoning (CN); Lizhi Yuan, Liaoning (CN); Luhua Jiang, Liaoning (CN)

(73) Assignee: DALIAN INSTITUTE OF CHEMICAL PHYSICS, CHINESE ACADEMY OF SCIENCES, Dalian, Liaoning (CN)

( * ) Notice: Subject to any disclaimer, the term of this patent is extended or adjusted under 35 U.S.C. 154(b) by 346 days.

(21) Appl. No.: 14/900,440

(22) PCT Filed: Dec. 19, 2014

(86) PCT No.: PCT/CN2014/094286
§ 371 (c)(1),
(2) Date: Dec. 21, 2015

(87) PCT Pub. No.: WO2016/082262
PCT Pub. Date: Jun. 2, 2016

(65) Prior Publication Data
US 2016/0367969 A1    Dec. 22, 2016

(30) Foreign Application Priority Data

Nov. 27, 2014  (CN) .......................... 2014 1 0697301
Nov. 27, 2014  (CN) .......................... 2014 1 0697811
(Continued)

(51) Int. Cl.
*B01J 23/66* (2006.01)
*B01J 23/02* (2006.01)
(Continued)

(52) U.S. Cl.
CPC ............... *B01J 23/66* (2013.01); *B01J 21/04* (2013.01); *B01J 23/02* (2013.01); *B01J 23/06* (2013.01);
(Continued)

(58) Field of Classification Search
CPC ..... B01J 31/1691; B01J 23/66; B01J 23/8926
See application file for complete search history.

(56) References Cited

U.S. PATENT DOCUMENTS

| | | | | |
|---|---|---|---|---|
| 2014/0107371 | A1* | 4/2014 | Bakker | ................. C07C 209/36 |
| | | | | 558/414 |
| 2014/0212944 | A1* | 7/2014 | Tian | ....................... B82Y 30/00 |
| | | | | 435/180 |
| 2016/0367969 | A1* | 12/2016 | Sun | .......................... C25D 3/02 |

FOREIGN PATENT DOCUMENTS

CN           101391304 A        3/2009

OTHER PUBLICATIONS

Qiwen Tang et al., "One step synthesis of carbon-supported Ag/MnyOx composites for oxygen reduction reaction in alkaline media", Applied Catalysis B: Environmental, 104 (2011); pp. 337-345.

(Continued)

*Primary Examiner* — Scott R Kastler
(74) *Attorney, Agent, or Firm* — Novick, Kim & Lee, PLLC; Allen Xue

(57) ABSTRACT

A hierarchical porous material contains primary pore aggregates. The primary pore aggregates combine to form the secondary pore aggregates. The secondary pore aggregates connect to each other formed the hierarchical porous material. There are primary pores on the primary pore aggregates wherein the diameter of primary pore is 5-500 nm. There are secondary pores on the secondary pore aggregates wherein the diameter of secondary pore is 1-5 μm. The hierarchical (Continued)

porous material is used as oxygen reduction reaction (ORR) catalysts or photocatalysts having a significantly improved catalytic activity.

17 Claims, 4 Drawing Sheets

(30) Foreign Application Priority Data

| | | |
|---|---|---|
| Nov. 27, 2014 | (CN) | 2014 1 0697812 |
| Nov. 27, 2014 | (CN) | 2014 1 0698615 |
| Nov. 27, 2014 | (CN) | 2014 1 0706344 |

(51) Int. Cl.

| | |
|---|---|
| *C25D 11/02* | (2006.01) |
| *B01J 21/04* | (2006.01) |
| *B01J 23/06* | (2006.01) |
| *B01J 23/14* | (2006.01) |
| *B01J 23/72* | (2006.01) |
| *B01J 23/89* | (2006.01) |
| *B01J 35/10* | (2006.01) |
| *B01J 37/34* | (2006.01) |
| *C23C 14/34* | (2006.01) |
| *C25D 3/02* | (2006.01) |
| *C25D 5/00* | (2006.01) |
| *C25D 9/08* | (2006.01) |
| *C23C 18/14* | (2006.01) |
| *B01J 23/50* | (2006.01) |
| *B01J 23/68* | (2006.01) |
| *B01J 35/00* | (2006.01) |

(52) U.S. Cl.
CPC ............ *B01J 23/14* (2013.01); *B01J 23/50* (2013.01); *B01J 23/688* (2013.01); *B01J 23/72* (2013.01); *B01J 23/892* (2013.01); *B01J 23/8906* (2013.01); *B01J 23/8913* (2013.01); *B01J 23/8926* (2013.01); *B01J 35/002* (2013.01); *B01J 35/006* (2013.01); *B01J 35/0013* (2013.01); *B01J 35/109* (2013.01); *B01J 35/1061* (2013.01); *B01J 35/1066* (2013.01); *B01J 35/1071* (2013.01); *B01J 35/1076* (2013.01); *B01J 37/348* (2013.01); *C23C 14/34* (2013.01); *C23C 18/14* (2013.01); *C25D 3/02* (2013.01); *C25D 5/00* (2013.01); *C25D 9/08* (2013.01); *C25D 11/02* (2013.01)

(56) References Cited

OTHER PUBLICATIONS

Ying Wang et al., "Silver supported on Co3O4 modified carbon as electrocatalyst for oxygen reduction reaction in alkaline media", Electrochemistry Communications, 31 (2013), pp. 108-111.

Keiichi Okajima et al., "Degradation Evaluation of Gas-Diffusion Electrodes for Oxygen-Depolarization in Chlor-Alkali Membrane Cell", Journal of the Electrochemical Society, 152 (8) D117-D120 (2005).

Ren-Hua Jin et al., "Fabrication of silver porous frameworks using poly(ethyleneimine) hydrogel as a soft sacrificial template", Journal of Materials Chemistry, 2005, 15, pp. 4513-4517.

Adam Holewinski et al., "High-performance Ag—Co alloy catalysts for electrochemical oxygen reduction", Nature Chemistry, vol. 6, Sep. 2014, pp. 828-834 (published online Aug. 11, 2014).

\* cited by examiner

HIERARCHICAL POROUS MATERIAL AND THE PREPARATION METHOD THEREOF

FIELD OF THE INVENTION

This invention belongs to the field of nanomaterials and specifically relates to a kind of hierarchical porous material and its preparation method.

BACKGROUND OF THE INVENTION

Nanoporous materials is one kind of nanostructured material developed in recent years. Because of its large specific surface area, Small density, adjustable structure, adjustable, and good permeability, it is widely applied in the field of separation, catalysis, Sensing, medicine, electrodes, machinery and so on.

The dealloy and template method are the mostly used to prepare porous metal. Zheng-qing Ma et al. acquired the high specific activity nanoporous silver powder by the dealloy method (reported in CN101391304A), the steps are: smelting the magnesium in the argon atmosphere, add the metallic silver when magnesium melt completely; then casting the silver-magnesium alloy; then mechanical crushing, ball milling, classification the casting product when it is cold. Then the Ag—Mg alloy powder was corroded by mixed acid to get to the size requirement, at last the porous silver powder was acquired after the treatment of washing, filtering and drying. Due to high temperature and argon atmosphere are needed in the smelting process when preparing the raw material, it is difficult for the equipment to acquire these high requirement. At the same time, the nitric acid and the sulfuric acid are always used as corrosion electrolyte in the electrochemical dissolution process. Therefore, the dealloy method is harmful to the operators and the environment. Jin R H and Yuan J J have (Journal of Materials Chemistry 15 (2005) 4513) prepared the macroporous silver powder by using poly (ethyleneimine) as template. The complex process and high cost make the template method hard to industrialization, also the pore structure of silver prepared by template method is single and hard to control.

Adzic team found that Cu monolayer can be formed on the noble metal particle surface through Cu-UPD, then Pt monolayer catalyst can be acquired through replacement reaction with $Pt^{2+}$, the highly dispersed Pt greatly enhanced the ORR mass catalytic activity of this kind of catalyst. However, precious metals, such as Au and Pd are always used as the core of this kind of catalyst, which makes the high cost of it. Compare with Pt, Pd and Au, Ag shows the advantage of large quantity and low cost, but short of research. Porous silver show great application prospect due to its high surface area and the good mass transfer ability, however, silver is easy to be corrode in the acid which limit its application in acidic environment. By replacing with noble metal (Pt, Pd), we can get noble metal shell-porous silver core material, which can be used in acidic environment. But this kind of research has not been reported.

The silver causes wide attention of the researchers because of its high activity and good stability in alkaline medium and the outstanding advantage of the methanol permeability resistance. The product of Ag/C catalyst in the field of alkaline anion exchange membrane fuel cell does already exist, while the ORR over potential of Ag/C was about 100-150 mV higher than Pt/C catalyst (reported in J. Electrochem. Soc. 152 (2005) D117). By combine Ag with $Co_3O_4$, the ORR catalytic activity can be enhanced (reported in Electrochem. Commun. 31 (2013) 108); tang et al. prepared $Ag/Mn_3O_4/C$ catalyst using one step method (reported in Appl. Catal. B: Environ. 104 (2011) 337), which reduce the gap of ORR over potential to Pt/C to 31 mV. That is to say, by combine silver with the oxide of manganese, cobalt et al., the ORR catalytic activity can be enhanced. Linic et al. (Nature Chem. 6 (2014) 828) reported that the catalytic activity of Ag can be enhanced by form AgCo alloy through quantum chemistry calculation. They also prepared the catalyst with AgCo alloy surface, which shows enhanced ORR catalytic activity compared with Ag, but the ORR activity compared with the Pt/C catalyst still has certain gap.

SUMMARY OF THE INVENTION

For the deficiencies of prior art, the present invention aims to provide a preparation method to synthesize porous material.

To achieve the objectives mentioned above, the present invention discloses the following embodiment.

A kind of hierarchical porous material is disclosed, and said hierarchical porous material is composed of primary pore aggregates which are made from nanoparticles, the primary pore aggregates are combined to form the secondary pore aggregates, then the secondary pore aggregates are aggregated each other and form the hierarchical porous material; there are primary pores on said primary pore aggregates wherein the diameter of primary pore is 5-500 nm; there are secondary pores on said secondary pore aggregates wherein the diameter of secondary pore is 1-5 μm.

Said nanoparticle is 20-300 nm in diameter, said primary pore aggregates is 0.5-5 μm in size.

Said hierarchical porous material is metal; said metal is selected from silver, copper, zinc, iron, aluminum, magnesium, lead and the alloys thereof.

Said hierarchical porous material is non-precious metal coated by precious metal; said precious metal is selected from platinum, palladium, gold or iridium, said non-precious metal is selected from silver, copper, zinc, iron, aluminum, magnesium, lead and the alloys thereof; the mass percentage of precious metal in the porous material is 1-99%.

Said hierarchical porous material is metal/metal oxide composite; said metal is selected from silver, copper, zinc, iron, aluminum, magnesium, lead and the alloys thereof; said metal oxide is selected from manganese oxide, iron oxide, cobalt oxide, nickel oxide, copper oxide, zinc oxide and the mixtures thereof; the mass percentage of metal oxide in porous material is 1-99%.

Said hierarchical porous material is metal/corresponding metal salt precipitate composite; said metal is selected from silver, copper, zinc, iron, aluminum, magnesium, lead and the alloys thereof; said metal salt precipitates are silver chloride, copper carbonate, zinc sulfide, ferrous phosphate, aluminum phosphate, magnesium phosphate and lead sulfide corresponding to silver, copper, zinc, iron, aluminum, magnesium and lead, respectively; the mass percentage of metal salt in porous material is 1-99%.

A preparation method of said hierarchical porous material, comprises the following steps,
(1) Performing oxidation treatment on metal materials in the electrolyte by electrochemical method;
(2) Reduce said metal materials acquired from step (1).
Said step (2) is complete reduction or incomplete reduction; said complete reduction obtains hierarchical porous metal material; said incomplete reduction obtains hierarchical porous metal/corresponding metal salt precipitate composite.

When said hierarchical porous material is non-precious metal coated with precious metal, also includes step of directly replacing the reduced metal material with the noble metal in the corresponding salt solutions or precipitating middle metal elements on the surface of the reduced metal material and then replacing with the noble metal in the corresponding salt solutions, or sputtering precious metal on the reduced metal material surface;

When said hierarchical porous material is metal/metal oxide composite, also includes the step of electrodepositing metal oxide on the reduced metal material surface.

The concentration of anions in the said electrolyte of step (1) is >1 mM, and said anion is select from $PO_4^{3-}$, $S^{2-}$, $CO_3^{2-}$, $Cl^-$, $Br^-$, $I^-$ and the mixtures thereof; said electrolyte also contains cations whose concentration is >1 mM, wherein said cation is select from $Na^+$, $K^+$, $H^+$ and the mixtures thereof.

Said preparation method of hierarchical porous material, wherein said reduction treatment in step (2) is one or more select from electroreduction, photoreduction, electron beam reduction, irradiation reduction and laser reduction.

Said preparation method of hierarchical porous material, wherein said the electro-oxidation treatment of metal material in the electrolyte includes: said metal materials is used as working electrode, counter electrode is selected from platinum, graphite rod, silver or gold, the reference electrode is select from silver/silver chloride, mercury/mercuric oxide or saturated calomel electrode.

When said hierarchical porous material is non-precious metal coated by precious metal, the said middle metal element is select from Cu, Pb and the mixtures thereof; said precious metal salt solution is select from chloroplatinic acid, chloroauric acid, chloropalladic acid, chloroiridic acid, platinum chloride, palladium chloride, iridium chloride, platinum nitrate and palladium nitrate and the mixtures thereof; the concentration of said precious metal salt solution is 1 mM-1 M; the reaction time of said replacement treatment is 10 s-2 h.

Said preparation method of hierarchical porous material, the method used to deposit middle metal on the surface of said hierarchical porous metal is selected from underpotential deposition or sputtering method.

Said preparation method of hierarchical porous material, wherein the electrolyte used in the said metal oxide metal oxide electrodeposition method is select from manganese nitrate, ferric nitrate, cobalt nitrate, nickel nitrate, copper nitrate, zinc nitrate, manganese acetate, ferric acetate, cobalt acetate, nickel acetate, copper acetate, zinc acetate and the mixtures thereof; the counter electrode is selected from platinum, graphite rod, silver or gold, the reference electrode is select from silver/silver chloride, mercury/mercuric oxide or saturated calomel electrode; the deposit metal oxide on the surface of said hierarchical porous silver is select from manganese oxide, ferric oxide, cobalt oxide, nickel oxide, copper oxide, zinc oxide and mixtures thereof.

Said preparation method of hierarchical porous material, wherein the electrodeposition method is select from cyclic voltammetry, linear sweep voltammetry, pulse voltammetry, potentiostatic method, galvanostatic method and combinations thereof.

Compared with existing technology, said hierarchical porous materials of this invention has apparent advantages of large surface area, high usage of precious metal and so on, which facilitating its mass transfer reaction when used as oxygen reduction reaction catalysts and other special applications. The preparation method of said hierarchical porous materials of this invention is green, simple, easy and low-cost as well as controllable pore size and porosity of hierarchical porous materials during preparation. When said hierarchical porous materials is used as oxygen reduction reaction (ORR) catalysts or photocatalysts, the catalytic activity can be improved significantly.

EMBODIMENTS

Figure 1:
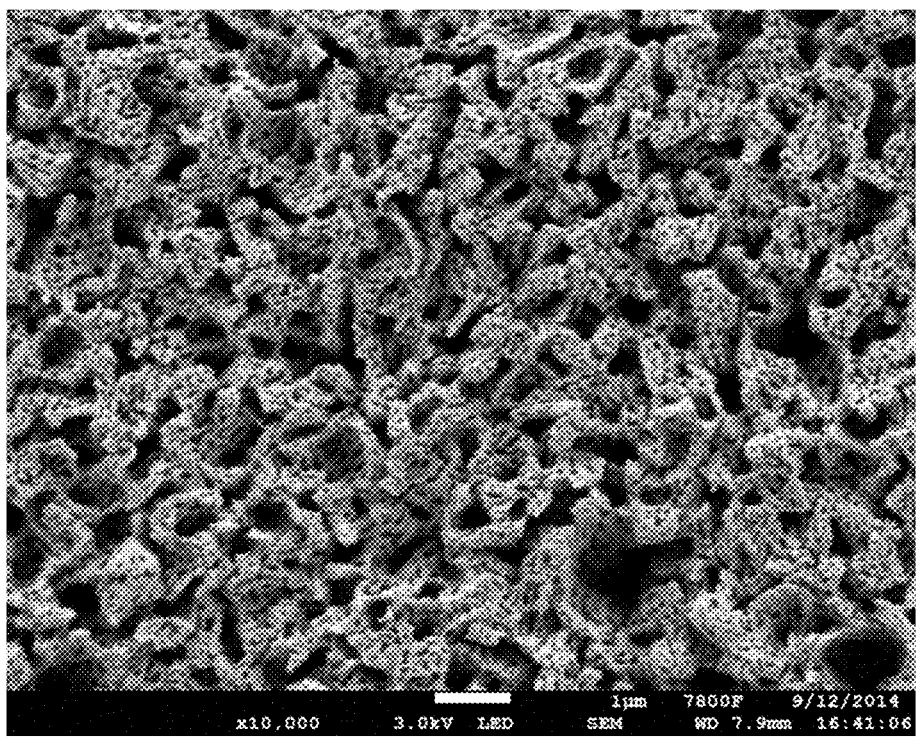
FIG. 1 shows the scanning electron microscope image of the hierarchical porous silver prepared in example 1.

The present invention may be further illustrated by the following non-limiting examples.

Comparative Example 1

Commercial 20% Pt/C catalyst. (Johnson Matthey, USA)

Comparative Example 2

Ag rotating disk electrode. (Circular, 5 mm in diameter, Tianjin Aidahengsheng technology CO., LTD)

Comparative Example 2

Pt rotating disk electrode. (Circular, 5 mm in diameter, Tianjin Aidahengsheng technology CO., LTD)

Example 1

The solution contains 0.005 M NaCl and 0.1 M NaOH act as the electrolyte, a silver bulk serves as a working electrode, the platinum foil works as a counter electrode, a mercury/mercuric oxide electrode is used as reference electrode, treat the working electrode at 1.0V (vs. Reversible Hydrogen Electrode (RHE)) for 2 h, then the hierarchical porous silver can be obtained by electroreduction the working electrode at 0.15 V in 0.1 M NaOH electrolyte for 5 min.

Example 2

The solution contains 0.005 M NaCl and 0.1 M NaOH act as the electrolyte, a silver bulk electrode serves as a working electrode, the platinum foil work as a counter electrode, a mercury/mercuric oxide electrode is used as a reference electrode, treat the working electrode at 1.0 V (Vs. RHE) for 2 h, then the hierarchical porous silver can be obtained by electroreduction the working electrode at 0.15 V in 0.1 M NaOH electrolyte for 5 min, then dip the obtained hierarchical porous Ag in 50 mM chloroplatinic acid for 10 min and obtain the platinum coated silver hierarchical porous materials after washing.

Example 3

The solution contains 0.005 M NaCl and 0.1 M NaOH act as the electrolyte, a silver bulk electrode serves as the working electrode, the platinum foil work as the counter electrode, a mercury/mercuric oxide electrode is used as the reference electrode, treat the working electrode at 1.0 V (Vs. RHE) for 2 h, then the hierarchical porous silver can be obtained by electroreduction the working electrode at 0.15 V in 0.1 M NaOH electrolyte for 5 min. Then the MnOx/Ag hierarchical porous can be obtained by electrodeposition MnOx on the hierarchical porous silver in the solution contains 50 mM manganous nitrate electrolyte, the platinum foil serves as the counter electrode and the silver/silver chloride electrode is used as the reference electrode during the electrodeposition process.

Example 4

The solution contains 0.005 M NaI and 0.1 M NaOH act as the electrolyte, a silver bulk electrode serves as working electrode, the platinum foil works as the counter electrode, a mercury/mercuric oxide electrode is used as the reference electrode, treat the working electrode at 1.0 V (Vs. RHE) for 8 h, then the Ag/AgI hierarchical porous material can be obtained by electroreduction the working electrode at 0.5 V in 0.1 M NaOH electrolyte for 11 s.

Example 5

The solution contains 0.001 mM NaCl act as the electrolyte, a silver foil serves as the working electrode, the graphite rod works as the counter electrode, and a silver/silver chloride electrode is used as the reference electrode, treat the working electrode at 1.5 V (Vs. RHE) for 100 h, then the hierarchical porous silver can be obtained by exposing the working electrode in 200,000 lux light for 1 h.

Example 6

The solution contains 0.1 M HCl act as the electrolyte, a silver foil serves as working electrode, the graphite rod works as the counter electrode, a saturated calomel electrode is used as the reference electrode, treat the working electrode at 2.0 V (Vs. RHE) for 1 h, then the hierarchical porous silver can be obtained by exposing the working electrode in 1 W laser for 1 h.

Example 7

The solution contains 2 M NaBr and 0.1 M HBr act as the electrolyte, a silver rod serves as the working electrode, the silver foil works as the counter electrode, a saturated calomel electrode is used as the reference electrode, treat the working electrode at 5.0 V (Vs. RHE) for 1 s, then the hierarchical porous silver can be obtained by exposing the working electrode in magnesium target X-ray for 1 h.

Example 8

The solution contains saturated NaBr act as the electrolyte, sintered silver powder serves as working electrode, the gold foil works as the counter electrode, and a silver/silver chloride electrode is used as reference electrode, treat the working electrode at 10.0 V (Vs. RHE) for 60 s, then the hierarchical porous silver can be obtained by bombard the working electrode by electron gun beam for 40 min.

Example 9

The solution contains 0.001 mM NaI act as the electrolyte, a silver foil serves as the working electrode, the graphite rod works as the counter electrode, a Ag/AgCl electrode is used as the reference electrode, treat the working electrode at 0.5 V (Vs. RHE) for 100 h, then the hierarchical porous silver can be obtained by treat the working electrode in 400° C. for 10 h.

Example 10

The solution contains 2 M NaI and 0.1 M HI act as the electrolyte, a silver rod serves as the working electrode, the silver foil works as the counter electrode, a saturated calomel electrode is used as reference electrode, treat the working electrode at 5.0 V (Vs. RHE) for 60 s, then the hierarchical porous silver can be obtained by exposing the working electrode in aluminum target X-ray for 1 h.

Example 11

The solution contains 0.1 M Cetyltrimethylammonium Chloride and 0.1 M NaOH act as the electrolyte, a silver foil serves as the working electrode, the graphite rod works as the counter electrode, and a silver/silver chloride electrode is used as the reference electrode, treat the working electrode at 1.5 V (Vs. RHE) for 1 h, then the hierarchical porous silver can be obtained by exposing the working electrode in 300,000 lux light for 20 min.

Example 12

The solution contains 0.5 M 1, 3-dimethyl imidazole salt bromine and 0.1 M NaOH act as the electrolyte, a silver rod serves as the working electrode, the silver foil works as the counter electrode, a saturated calomel electrode is used as the reference electrode, treat the working electrode at 2.0 V (Vs. RHE) for 5 h, then the hierarchical porous silver can be obtained by exposing the working electrode in aluminum target X-ray for 2 h.

Example 13

The solution contains 2 M NaCl and 0.1 M HCl act as the electrolyte, a silver rod serves as the working electrode, the silver foil works as the counter electrode, a saturated calomel electrode is used as the reference electrode, treat the working electrode at 5.0 V (Vs. RHE) for 360 s, then the hierarchical porous silver can be obtained by exposing the working electrode in copper target X-ray for 1 h, then dipping the obtained hierarchical porous Ag in 50 mM chloropalladic acid for 10 min and then obtain the palladium coated silver hierarchical porous materials after washing.

Example 14

The solution contains saturated NaCl act as the electrolyte, sintered silver powder serves as the working electrode, the gold foil works as the counter electrode, and a silver/silver chloride electrode is used as the reference electrode, treat the working electrode at 10.0 V (Vs. RHE) for 1 s, then the hierarchical porous silver can be obtained by bombard the working electrode by electron gun beam for 20 min. Underpotential deposition copper on the obtained hierarchical porous silver in 50 mM copper nitrate and 50 mM nitric acid solutions at 390 mV (Vs. RHE) for 5 min, then dipping the obtained hierarchical porous Ag in 50 mM chloroauric acid for 10 min. Then obtain the gold coated silver hierarchical porous materials after washing.

Example 15

The solution contains 0.1 M HCl act as the electrolyte, a silver foil serves as the working electrode, the Pt foil works as the counter electrode, a saturated calomel electrode is used as the reference electrode, treat the working electrode at 2.0 V (Vs. RHE) for 1 h, then the hierarchical porous silver can be obtained by exposing the working electrode in 1 W laser for 1 h, then dipping the obtained hierarchical porous Ag in 50 mM Chloroiridic acid for 10 min and then obtain the iridium coated silver hierarchical porous materials after washing.

Example 16

The solution contains 0.005 M NaBr and 0.1 M NaOH act as the electrolyte, a silver bulk electrode serves as the working electrode, the platinum foil work as the counter electrode, a mercury/mercuric oxide electrode is used as the reference electrode, treat the working electrode at 1.0 V (Vs. RHE) for 2 h, then the hierarchical porous silver can be obtained by electroreduction the working electrode at 0.15 V in 0.1 M NaOH electrolyte for 5 min, then dipping the obtained hierarchical porous Ag in 50 mM chloroplatinic acid for 10 min and then obtain the platinum coated silver hierarchical porous materials after washing.

Example 17

The solution contains saturated NaBr act as the electrolyte, sintered silver powder serves as the working electrode, the gold foil works as the counter electrode, and a silver/silver chloride electrode is used as the reference electrode, treat the working electrode at 10.0 V (Vs. RHE) for 60 s, then the hierarchical porous silver can be obtained by bombard the working electrode by electron gun beam for 40 min, then dipping the obtained hierarchical porous Ag in 50 mM chloropalladic acid for 10 min. Then obtain the palladium coated silver hierarchical porous materials after washing.

Example 18

The solution contains 0.1 M HBr act as the electrolyte, a silver foil serves as the working electrode, the Pt foil works as the counter electrode, a saturated calomel electrode is used as the reference electrode, treat the working electrode at 2.0 V (Vs. RHE) for 1 h, then the hierarchical porous silver can be obtained by exposing the working electrode in 2 W laser for 3 h. Underpotential deposition lead on the obtained hierarchical porous silver in 50 mM lead nitrate and 50 mM nitric acid solutions at −210 mV (Vs.RHE) for 5 min, then dipping the obtained hierarchical porous Ag in 50 mM chloroplatinic acid for 10 min and then obtain the platinum coated silver hierarchical porous materials after washing.

Example 19

The solution contains 0.001 mM NaI act as the electrolyte, a silver foil serves as the working electrode, the graphite rod work as counter electrode, a Ag/AgCl electrode is used as reference electrode, treat the working electrode at 0.5 V (Vs. RHE) for 100 h, then the hierarchical porous silver can be obtained by treat the working electrode in 400° C. for 10 h, then dipping the obtained hierarchical porous Ag in 50 mM chloroplatinic acid for 10 min. Then obtain the platinum coated silver hierarchical porous materials after washing.

Example 20

The solution contains 0.001 mM NaCl act as the electrolyte, a silver foil serves as the working electrode, the graphite rod works as the counter electrode, and a silver/silver chloride electrode is used as the reference electrode, treat the working electrode at 1.5 V (Vs. RHE) for 100 h, then the hierarchical porous silver can be obtained by exposing the working electrode in 200,000 lux light for 1 h, then the CuOx/Ag hierarchical porous can be obtained by elctrodeposition CuOx on the hierarchical porous silver in the solution contains 50 mM copper nitrate electrolyte, the platinum foil works as the counter electrode and the silver/silver chloride electrode is used as reference electrode during the electrodeposition process.

Example 21

The solution contains saturated NaCl act as the electrolyte, sintered silver powder serves as the working electrode, the gold foil works as the counter electrode, and a silver/silver chloride electrode is used as the reference electrode, treat the working electrode at 10.0 V (Vs. RHE) for 1 s, then the hierarchical porous silver can be obtained by bombard the working electrode by electron gun beam for 20 min, then the CoOx/Ag hierarchical porous can be obtained by elctrodeposition CoOx on the hierarchical porous silver in the solution contains 50 mM cobalt nitrate electrolyte, the platinum foil works as the counter electrode and the silver/silver chloride electrode is used as the reference electrode during the electrodeposition process.

Example 22

The solution contains 0.001 mM NaBr act as the electrolyte, a silver foil serves as the working electrode, the graphite rod works as the counter electrode, and a silver/silver chloride electrode is used as the reference electrode, treat the working electrode at 1.5 V (Vs. RHE) for 100 h, then the hierarchical porous silver can be obtained by exposing the working electrode in 500,000 lux light for 5 min, then the ZnOx/Ag hierarchical porous can be obtained by elctrodeposition ZnOx on the hierarchical porous silver in the solution contains 50 mM zinc nitrate electrolyte, the platinum foil works as the counter electrode and the silver/silver chloride electrode is used as the reference electrode during the electrodeposition process.

Example 23

The solution contains 2 M NaCl and 0.1 M HCl act as the electrolyte, a silver rod serves as the working electrode, the silver foil works as the counter electrode, a saturated calomel electrode is used as the reference electrode, treat the working electrode at 5.0 V (Vs. RHE) for 360 s, then the hierarchical porous silver can be obtained by exposing the working electrode in copper target X-ray for 1 h, then the FeOx/Ag hierarchical porous can be obtained by elctrodeposition FeOx on the hierarchical porous silver in the solution contains 50 mM iron acetate electrolyte, the platinum foil work as the counter electrode and the silver/silver chloride electrode is used as reference electrode during the electrodeposition process.

Example 24

The solution contains 0.1 M HCl act as the electrolyte, a silver foil serves as the working electrode, the Pt foil works as the counter electrode, a saturated calomel electrode is used as the reference electrode, treat the working electrode at 2.0 V (Vs. RHE) for 1 h, then the hierarchical porous silver can be obtained by exposing the working electrode in 1 W laser for 1 h, then the NiOx/Ag hierarchical porous can be obtained by elctrodeposition NiOx on the hierarchical porous silver in the solution contains 50 mM nickel acetate electrolyte, the platinum foil works as the counter electrode and the silver/silver chloride electrode is used as the reference electrode during the electrodeposition process.

Example 25

The solution contains 2 M NaCl and 0.1 M HCl act as the electrolyte, a silver rod serves as the working electrode, the silver foil works as the counter electrode, a saturated calomel electrode is used as the reference electrode, treat the working electrode at 5.0 V (Vs. RHE) for 360 s, then the Ag/AgCl hierarchical porous can be obtained by exposing the working electrode in copper target X-ray for 5 s.

Example 26

The solution contains 0.001 mM NaBr act as the electrolyte, a silver foil serves as the working electrode, the graphite rod works as the counter electrode, and a silver/silver chloride electrode is used as the reference electrode, treat the working electrode at 1.5 V (Vs. RHE) for 100 h, then the Ag/AgBr hierarchical porous can be obtained by exposing the working electrode in 500,000 lux light for 20 s.

Example 27

The solution contains 2 M NaI and 0.1 M HI act as the electrolyte, a silver rod serves as the working electrode, the silver foil works as the counter electrode, a saturated calomel electrode is used as the reference electrode, treat the working electrode at 5.0 V (Vs. RHE) for 60 s, then the Ag/AgI hierarchical porous can be obtained by exposing the working electrode in aluminum target X-ray for 20 s.

Example 28

The solution contains saturated NaI act as the electrolyte, sintered silver powder serves as the working electrode, the gold foil works as the counter electrode, and a silver/silver chloride electrode is used as the reference electrode, treat the working electrode at 10.0 V (Vs. RHE) for 10 s, then the Ag/AgI hierarchical porous can be obtained by bombarding the working electrode by electron gun beam for 20 s.

Example 29

The solution contains 0.1 M $Na_3PO_4$ act as the electrolyte, a magnesium foil serves as the working electrode, the platinum foil works as the counter electrode, a mercury/mercuric oxide electrode is used as the reference electrode, treat the working electrode at 2.5 V (Vs. RHE) for 2 h, then the hierarchical porous magnesium can be obtained by electroreduction the working electrode at −1.5 V (Vs. RHE) for 200 s.

Example 30

The solution contains 0.3 M $Na_3PO_4$ as the electrolyte, an aluminum foil serves as the working electrode, the platinum foil works as the counter electrode, a mercury/mercuric oxide electrode is used as the reference electrode, treat the working electrode at 2.0 V (Vs. RHE) for 1 h, then the hierarchical porous aluminum can be obtained by electroreduction the working electrode at −1.0 V for 150 s.

Example 31

The solution contains 0.4 M $Na_2S$ as the electrolyte, a zinc foil serves as the working electrode, the platinum foil work as the counter electrode, a mercury/mercuric oxide electrode is used as the reference electrode, treat the working electrode at 1.8 V (Vs. RHE) for 30 min, then the hierarchical porous zinc can be obtained by electroreduction the working electrode at −1.3 V (Vs. RHE) for 100 s.

Example 32

The solution contains 0.5 M $Na_3PO_4$ act as the electrolyte, an iron foil serves as the working electrode, the platinum foil work as the counter electrode, a silver/silver chloride electrode is used as the reference electrode, treat the working electrode at 2.6 V (Vs. RHE) for 1.5 h, then the hierarchical porous iron can be obtained by electroreduction the working electrode at −1.2 V (Vs. RHE) for 300 s.

Example 33

The solution contains 0.6 M $Na_2S$ as the electrolyte, a lead foil serves as the working electrode, the platinum foil works as the counter electrode, a mercury/mercuric oxide electrode is used as the reference electrode, treat the working electrode at 2.0 V (Vs. RHE) for 2.5 h, then the hierarchical porous lead can be obtained by electroreduction the working electrode at −0.9 V for 500 s.

Example 34

The solution contains 0.7 M $Na_2CO_3$ as the electrolyte, a copper foil serves as the working electrode, the platinum foil works as the counter electrode, a mercury/mercuric oxide electrode is used as the reference electrode, treat the working electrode at 1.5 V (Vs. RHE) for 4 h, then the hierarchical porous copper can be obtained by electroreduction the working electrode at −1.4 V (Vs. RHE) for 1000 s.

FIG. 1 shows the scanning electron microscope image of the hierarchical porous silver prepared in example 1. From FIG. 1 we can see that the obtained porous silver with hierarchical porous structure, by analysis we can know that the primary pore is the space left by the aggregation of silver nanoparticles, the secondary pore is the space left by the aggregation of primary pore aggregates. From FIG. 1 we can know that the diameter of primary pore and secondary pore are 5-500 nm and 1-5 μm, respectively.

Figure 2:
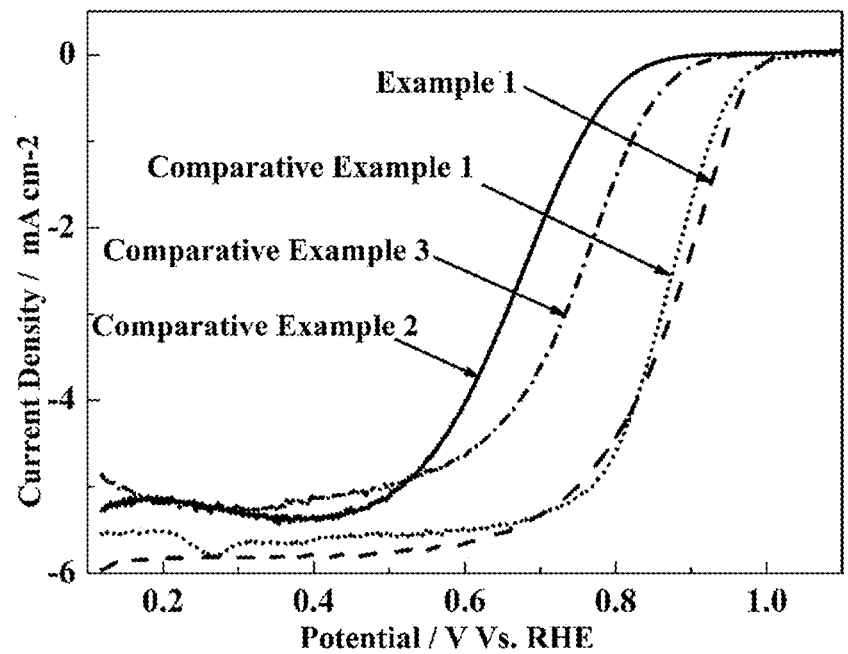
FIG. 2 shows the ORR catalytic activity of the hierarchical porous silver prepared in comparative examples 1-3 and example 1.

FIG. 2 shows the ORR catalytic activity of the hierarchical porous silver prepared in comparative examples 1-3 and example 1. From FIG. 2 we can know that the large specific surface area and the good mass transfer ability caused by its pore structure make hierarchical porous silver shows the best ORR catalytic activity.

Figure 3:
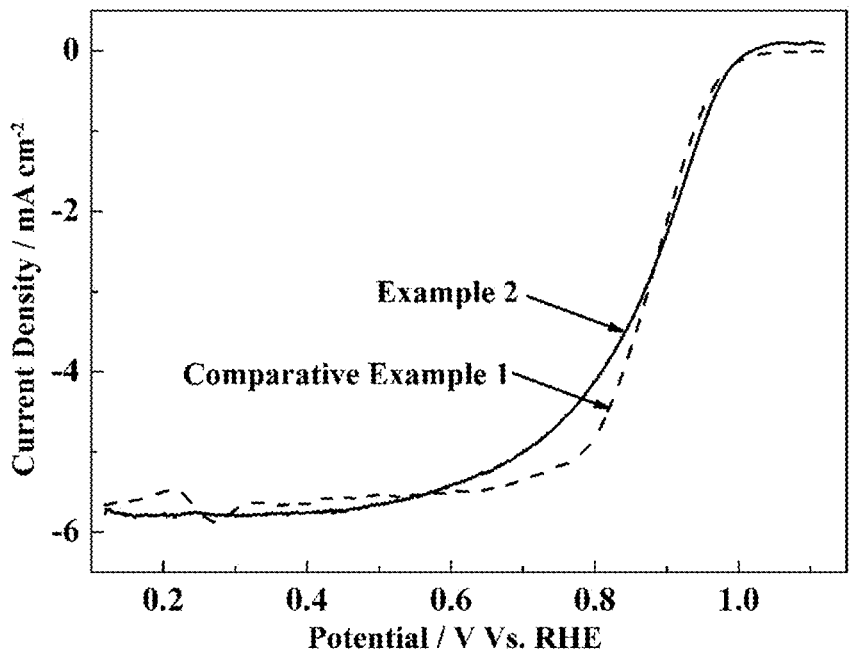
FIG. 3 shows the ORR catalytic activity of the hierarchical porous silver and hierarchical porous platinum coated silver prepared in comparative example 1 and example 2.

FIG. 3 shows the ORR catalytic activity of the hierarchical porous silver and hierarchical porous platinum coated silver prepared in comparative example 1 and example 2. From FIG. 3 we can see that Pt coated silver hierarchical material shows almost the same ORR specific catalytic activity.

Figure 4:
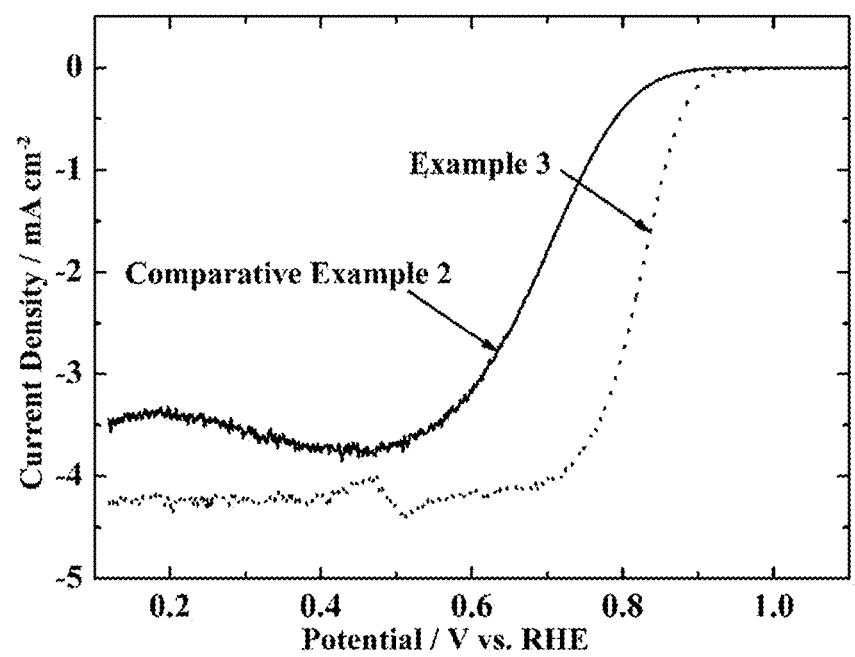
FIG. 4 shows the ORR catalytic activity of the hierarchical porous MnOx/Ag prepared in comparative examples 2 and example 3.

FIG. 4 shows the ORR catalytic activity of the hierarchical porous MnOx/Ag prepared in comparative examples 2 and example 3. We can see from FIG. 4 the ORR catalytic activity of polycrystalline silver has greatly enhanced after deposit manganese oxide on its surface.

Figure 5:
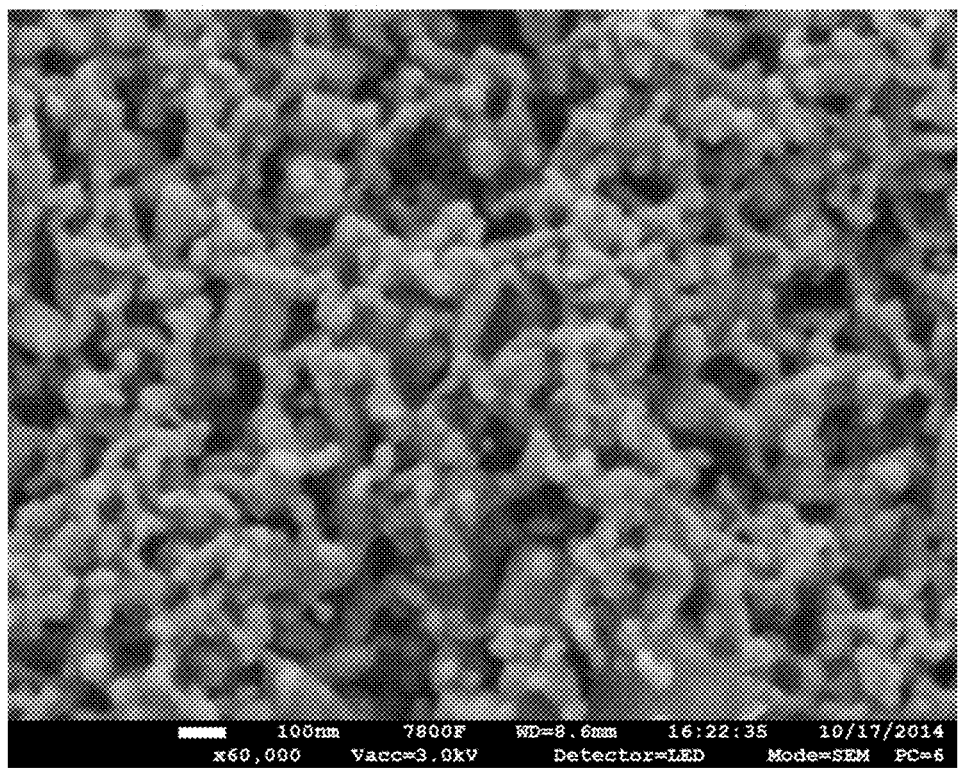
FIG. 5 shows the scanning electron microscope image of the hierarchical porous Ag/AgI prepared in example 4.

FIG. 5 shows the scanning electron microscope image of the hierarchical porous Ag/AgI prepared in example 4. Ag/AgI hierarchical material is formed by the stacking of silver coated silver iodide; from the figure we can see that the diameter of silver nanoparticle and silver iodide are 10-90 nm and 0.1-0.5 μm, respectively.

We claim:

1. A hierarchical porous material, comprising:
   a plurality of primary pore aggregates, each formed by aggregating a plurality of nanoparticles;
   a plurality of secondary pore aggregates, each formed by aggregating primary pore aggregates; and
   a complex of the secondary pore aggregates formed by aggregating secondary pore aggregates,
   wherein primary pores on said primary pore aggregates have a diameter in a range of 5-500 nm, and secondary pores on said secondary pore aggregates have a diameter in a range of 1-5 μm,
   wherein said hierarchical porous material is a metallic material, a metal/metal oxide composite, or a composite of metal/corresponding metal salt precipitate.

2. The hierarchical porous material of claim 1, wherein each of the plurality of nanoparticles is 20-300 nm in diameter, and each of said primary pore aggregates is 0.5-5 μm in diameter.

3. The hierarchical porous material of claim 1, wherein said hierarchical porous material is a metal selected from silver, copper, zinc, iron, aluminum, magnesium, lead, and alloys thereof.

4. The hierarchical porous material of claim 1, wherein said hierarchical porous material comprises a non-precious metal coated by a precious metal, wherein said precious metal is platinum, palladium, gold, or iridium, said non-precious metal is silver, copper, zinc, iron, aluminum, magnesium, lead, or alloys thereof, and a mass percentage of the precious metal in the hierarchical porous material is 1-99%.

5. The hierarchical porous material of claim 1, wherein said hierarchical porous material is the metal/metal oxide composite, and said metal in the composite is selected from group consisting of silver, copper, zinc, iron, aluminum, magnesium, lead, and alloys thereof, and said metal oxide in the composite is selected from the group consisting of manganese oxide, iron oxide, cobalt oxide, nickel oxide, copper oxide, zinc oxide, and mixtures thereof, and the mass percentage of the metal oxide in the hierarchical porous material is 1-99%.

6. The hierarchical porous material of claim 1, wherein said hierarchical porous material is the metal/corresponding metal salt precipitate composite, said metal in the composite is selected from the group consisting of silver, copper, zinc, iron, aluminum, magnesium, lead, and alloys thereof, and said metal salt precipitate is selected from the group consisting of silver chloride, copper carbonate, zinc sulfide, ferrous phosphate, aluminum phosphate, magnesium phosphate, and lead sulfide, and a mass percentage of the metal salt precipitate in the hierarchical porous material is 1-99%.

7. A preparation method of the hierarchical porous material of claim 1, comprises the following steps,
   (1) oxidizing a metal material in an electrolyte; said electrolyte contains an anion that is capable to form a precipitant with a cation of said metal material, and the electrolyte contains no metal cation that is capable to react with said metal material; and
   (2) reducing the oxidized metal material acquired from step (1).

8. The preparation method of the hierarchical porous material of claim 7, wherein said step (2) is a complete reduction that produces the metallic material.

9. The preparation method of the hierarchical porous material of claim 7, wherein said hierarchical porous material is the non-precious metal coated with precious metal, and the preparation method further comprises: replacing the reduced metal material with a precious metal by exchanging in a solution of a salt of the precious metal; or sputtering the precious metal on a surface of the reduced metal material.

10. The preparation method of the hierarchical porous material of claim 7, wherein a concentration of anions in said electrolyte of step (1) is >1 mM, and said anion is select from the group consisting of $PO_4^{3-}$, $S^{2-}$, $CO_3^{2-}$, $Cl^-$, $Br^-$, $I^-$, and the mixtures thereof, and a concentration of cations in said electrolyte of step (1) is >1 mM, wherein said cations is select from the group consisting of $Na^+$, $K^+$, $H^+$, and mixtures thereof.

11. The preparation method of the hierarchical porous material of claim 7, wherein said reduction in step (2) is electroreduction, photoreduction, electron beam reduction, irradiation reduction, or laser reduction.

12. The preparation method of the hierarchical porous material of claim 7, wherein, in step (1), said metal material serves as a working electrode, a counter electrode is platinum, graphite rod, silver, or gold, a reference electrode is silver/silver chloride, mercury/mercuric oxide, or saturated calomel electrode, and the electrolyte contains one or more halogen is select from the group consisting of $Cl^-$, $Br^-$, and $I^-$.

13. The preparation method of the hierarchical porous material of claim 7, said precious metal salt solution is select from the group consisting of chloroplatinic acid, chloroauric acid, chloropalladic acid, chloroiridic acid, platinum chloride, palladium chloride, iridium chloride, platinum nitrate, palladium nitrate, and mixtures thereof, the concentration of said precious metal salt solution is 1 mM-1 M, and a reaction time is 10 s-2 h.

14. The preparation method of the hierarchical porous material of claim 13, said hierarchical porous material is the metal/metal oxide composite, the preparation method further comprises electrodepositing a metal oxide on the surface of the reduced metal material.

15. The preparation method of the hierarchical porous material of claim 14, wherein the electrolyte used in the said metal oxide electrodeposition method is select from the group consisting of manganese nitrate, ferric nitrate, cobalt nitrate, nickel nitrate, copper nitrate, zinc nitrate, manganese acetate, ferric acetate, cobalt acetate, nickel acetate, copper acetate, zinc acetate, and mixtures thereof; the counter electrode is platinum, graphite rod, silver or gold, a reference electrode is silver/silver chloride, mercury/mercuric oxide, or saturated calomel electrode, and the metal oxide on the surface of said hierarchical porous silver is select from the group consisting of manganese oxide, ferric oxide, cobalt oxide, nickel oxide, copper oxide, zinc oxide, and mixtures thereof.

16. The preparation method of the hierarchical porous material of claim 15, wherein said electrodeposition is carried out by cyclic voltammetry, linear sweep voltammetry, pulse voltammetry, potentiostatic method, galvanostatic method, or combinations thereof.

17. The preparation method of the hierarchical porous material of claim 7, wherein said step (2) is an incomplete reduction that produces the metal/corresponding metal salt precipitate composite.

* * * * *